United States Patent
Ishikawa et al.

(10) Patent No.: US 9,306,080 B2
(45) Date of Patent: Apr. 5, 2016

(54) OPTICAL WIRING SUBSTRATE, MANUFACTURING METHOD OF OPTICAL WIRING SUBSTRATE AND OPTICAL MODULE

(71) Applicant: Hitachi Metals, Ltd., Tokyo (JP)

(72) Inventors: Hiroshi Ishikawa, Hitachi (JP); Kouki Hirano, Hitachinaka (JP); Hiroki Yasuda, Mito (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/197,736

(22) Filed: Mar. 5, 2014

(65) Prior Publication Data

US 2014/0334770 A1 Nov. 13, 2014

(30) Foreign Application Priority Data

May 7, 2013 (JP) .................................. 2013-097751

(51) Int. Cl.
*G02B 6/42* (2006.01)
*H01L 31/02* (2006.01)

(52) U.S. Cl.
CPC .......... *H01L 31/02005* (2013.01); *G02B 6/428* (2013.01); *G02B 6/4214* (2013.01)

(58) Field of Classification Search
CPC ........................ G02B 6/428; H01L 31/02005
See application file for complete search history.

(56) References Cited

U.S. PATENT DOCUMENTS

2010/0061679 A1* 3/2010 Hayashi et al. ................. 385/14

FOREIGN PATENT DOCUMENTS

JP 2009-151072 7/2009

* cited by examiner

*Primary Examiner* — Omar R Rojas
(74) *Attorney, Agent, or Firm* — Roberts Mlotkowski Safran & Cole, PC

(57) ABSTRACT

An optical wiring substrate includes an insulation layer including a resin, and a conductor layer formed on the insulation layer and including a metal and an inclined surface inclined relative to an optical axis of an optical fiber. A first wiring pattern and a second wiring pattern are formed in the conductor layer, the first wiring pattern including a first connecting part to which a first electrode of a photoelectric conversion element is connected, and the second wiring pattern including a second connecting part to which a second electrode of the photoelectric conversion element is connected. A distance between the first wiring pattern and the second wiring pattern is narrowest between the first connecting part and the second connecting part. A distance between the first connecting part and the second connecting part is less than a dimension of the conductor layer in a thickness direction thereof.

8 Claims, 9 Drawing Sheets

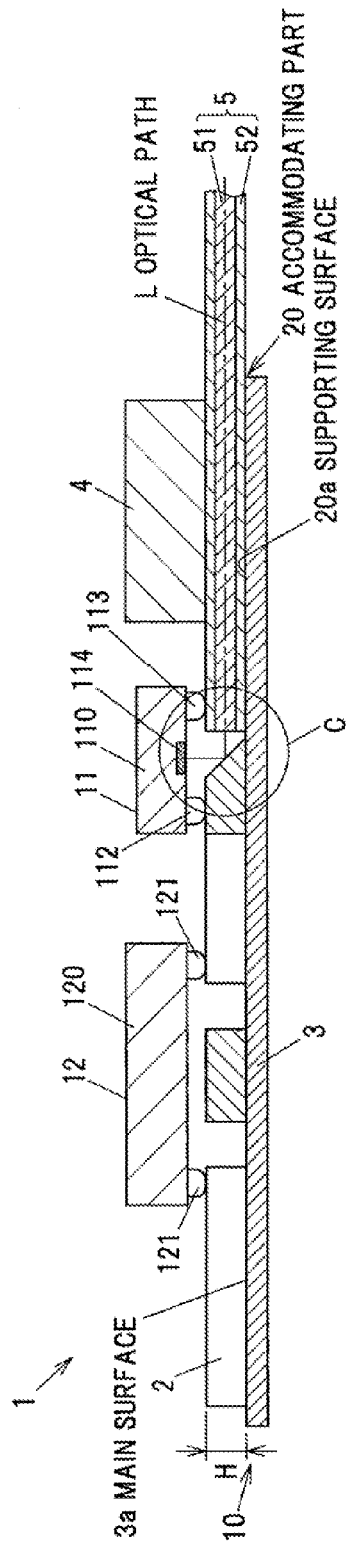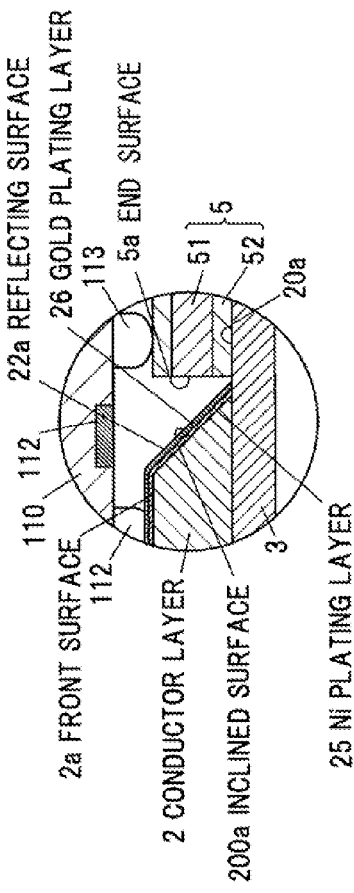

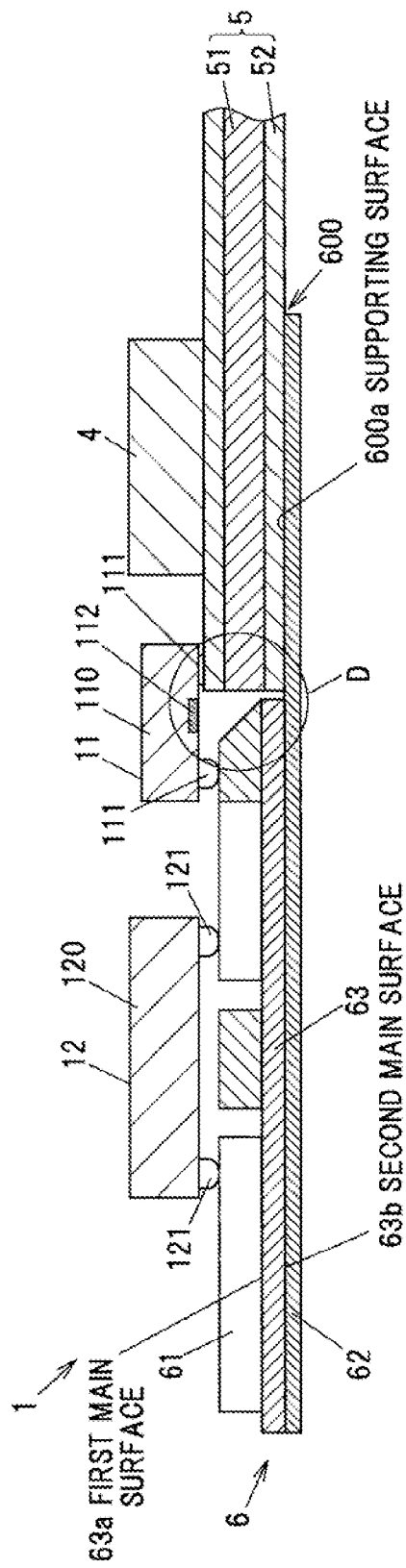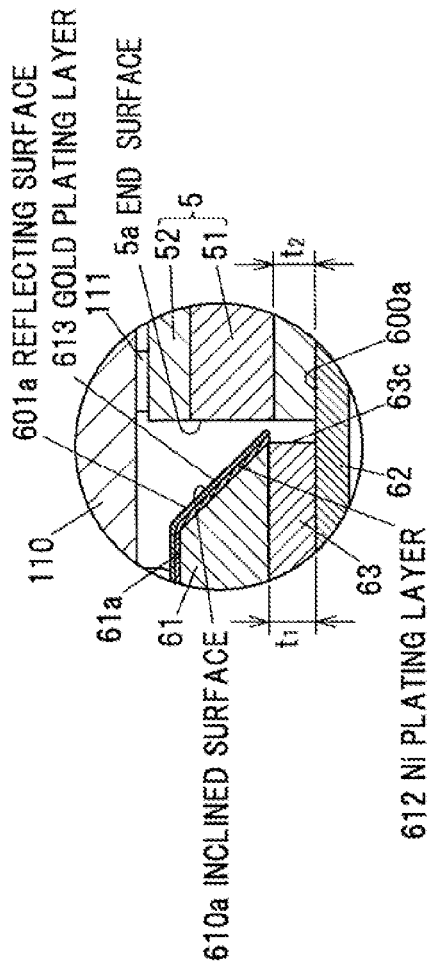

US 9,306,080 B2

OPTICAL WIRING SUBSTRATE, MANUFACTURING METHOD OF OPTICAL WIRING SUBSTRATE AND OPTICAL MODULE

The present application is based on Japanese patent application No. 2013-097751 filed on May 7, 2013, the entire contents of which are incorporated herein by reference.

BACKGROUND OF THE INVENTION

1. Field of the Invention

This invention relates to an optical wiring substrate in which wiring patterns are formed, a manufacturing method of the optical wiring substrate and an optical module using an optical wiring substrate.

2. Description of the Related Art

An optical module is known in which electric wirings are patterned and a photoelectric conversion element is mounted (See e.g., JP-A-2009-151072).

The optical module disclosed in JP-A-2009-151072 includes a substrate comprised of an insulating resin layer and a metal layer formed on the surface of the insulating resin layer, a photoelectric conversion element mounted on the substrate, an optical waveguide optically connected to an optical fiber, an optical signal path conversion component in which a reflecting surface is formed, the reflecting surface being configured to reflect a light that propagates an inner portion of the optical fiber and the optical waveguide. In order to accurately reflect the light signal from the optical waveguide side to the photoelectric conversion element side or from the photoelectric conversion element side to the optical waveguide side, the photoelectric conversion element has a height corresponding to the size of the thickness direction of the optical waveguide (the outer diameter of the optical fiber). A method of forming a wiring pattern includes forming a resist pattern in conformity to the wiring pattern, and forming the wiring pattern by etching.

SUMMARY OF THE INVENTION

The optical wiring substrate disclosed in JP-A-2009-151072 needs to separately mount an optical signal path conversion component thereon, so that increase in the number of components and working man-hours is caused. Then, the inventors of the present application have got the idea for forming a reflecting surface in a part of the wiring pattern and converting the optical path of the light that propagates through the optical fiber by the reflecting surface. In this case, it is necessary to form the wiring pattern by a metal layer having a thickness according to the height of the reflecting surface (the outer diameter of the optical fiber), and gaps between regions being close to each other of the neighboring wiring patterns are needed to be broadened according to the thickness of the metal layer. For example, if the metal layer has a thickness of 70 µm, in order to accurately form the wiring patterns by etching, it is preferred to ensure that the distance between the neighboring wiring patterns is not less than 70 µm.

On the other hand, recently in association with density growth of components in an electronic device such as an information processing device, a communicating device, a photoelectric conversion element is also increasingly miniaturized, thus a distance between the electrode pads of the photoelectric conversion element becomes narrow. In case that the wiring patterns are formed by using the above-mentioned thick metal layer, if the distance between the electrode pads of the photoelectric conversion element is narrower than the distance between the wiring patterns, this makes it impossible for the photoelectric conversion element to be mounted on the wiring patterns.

It is an object of the invention to provide an optical wiring substrate that is capable of responding to downsizing of mounted components though a reflecting surface is formed on a part of wiring patterns, as well as a manufacturing method of the optical wiring substrate and an optical module using the optical wiring substrate.

(1) According to one embodiment of the invention, an optical wiring substrate comprises:

an insulation layer comprising a resin; and a conductor layer formed on the insulation layer and comprising a metal and an inclined surface inclined relative to an optical axis of an optical fiber, wherein a first wiring pattern and a second wiring pattern are formed in the conductor layer, the first wiring pattern comprising a first connecting part to which a first electrode of a photoelectric conversion element is connected, and the second wiring pattern comprising a second connecting part to which a second electrode of the photoelectric conversion element is connected, wherein a distance between the first wiring pattern and the second wiring pattern is narrowest between the first connecting part and the second connecting part, and wherein a distance between the first connecting part and the second connecting part is less than a dimension of the conductor layer in a thickness direction thereof.

(2) According to another embodiment of the invention, an optical module comprises:

the optical wiring substrate according to the above embodiment (1); and the photoelectric conversion element mounted on the optical wiring substrate by flip-chip mounting.

(3) According to another embodiment of the invention, a manufacturing method of the optical wiring substrate according to the above embodiment (1) comprises:

forming the conductor layer on a surface of the insulation layer; and removing a part of the conductor layer so as to form the first wiring pattern and the second wiring pattern, wherein the forming of the first wiring pattern and the second wiring pattern comprises:

coating a resist on the conductor layer such that the distance between the first wiring pattern and the second wiring pattern is narrowest between the first connecting part and the second connecting part, and the distance between the first connecting part and the second connecting part is less than the dimension of the conductor layer in the thickness direction; and removing by etching a part of the conductor layer that is not coated with the resist.

Effects of the Invention

According to one embodiment of the invention, an optical wiring substrate can be provided that is capable of responding to downsizing of mounted components though a reflecting surface is formed on a part of wiring patterns, as well as a manufacturing method of the optical wiring substrate and an optical module using the optical wiring substrate.

BRIEF DESCRIPTION OF THE DRAWINGS

The preferred embodiments according to the invention will be explained below referring to the drawings, wherein:

FIG. 3A is a cross-sectional view taken along the line B-B in FIG. 1;

FIG. 3B is a partial enlarged view of C part in FIG. 3A;

FIG. 8A is a cross-sectional view schematically showing an optical module according to the second embodiment of the invention;

FIG. 8B is a partial enlarged view of D part in FIG. 8A; and

DETAILED DESCRIPTION OF THE PREFERRED EMBODIMENTS

First Embodiment

Figure 1:
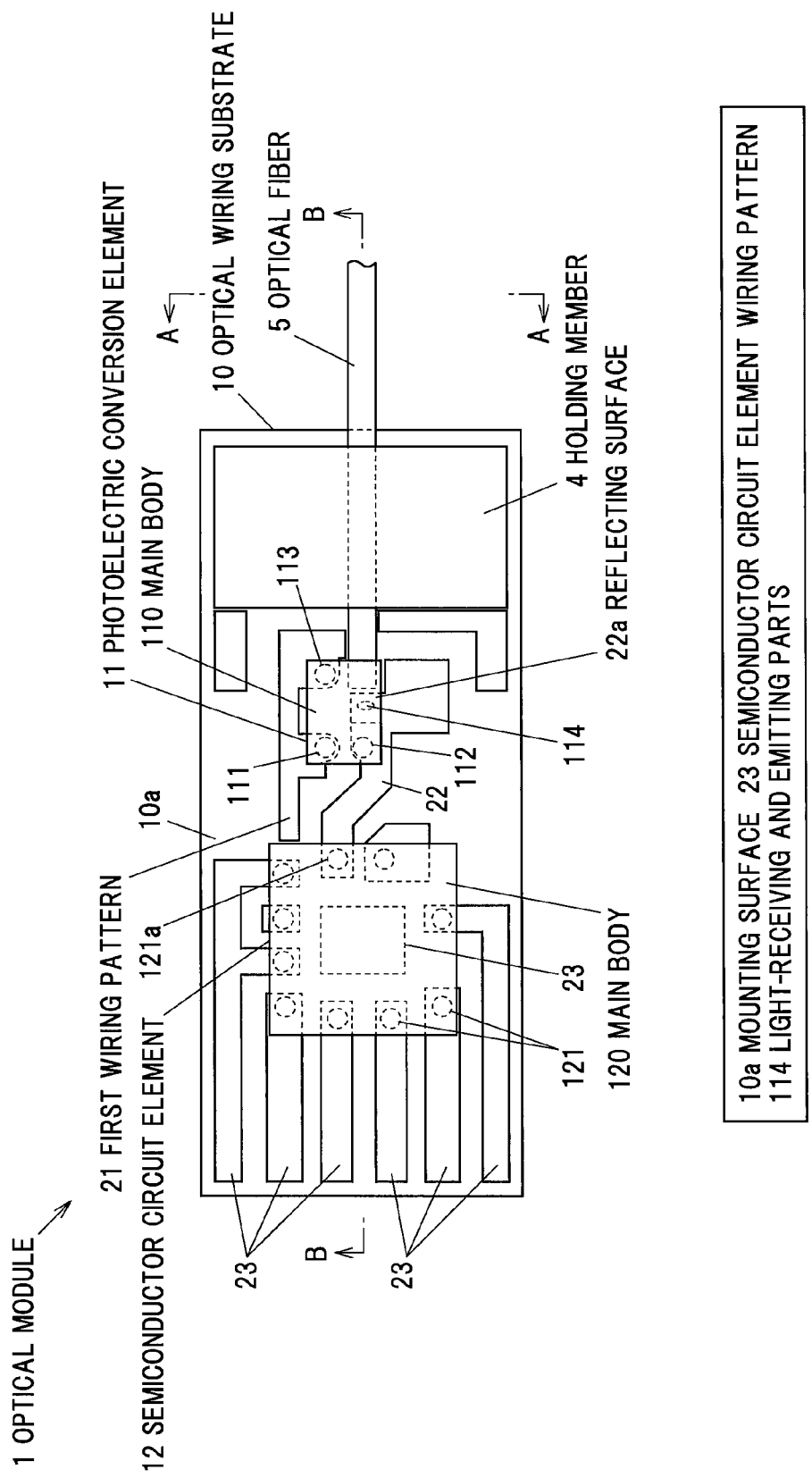
FIG. 1 is a plan view schematically showing a configuration example of an optical wiring substrate and an optical module including the optical wiring substrate according to a first embodiment of the invention.

FIG. 1 is a plan view schematically showing a configuration example of an optical wiring substrate and an optical module including the optical wiring substrate according to a first embodiment of the invention.

(Configuration of Optical Module 1)

The optical module 1 includes an optical wiring substrate 10, a photoelectric conversion element 11 mounted on a mounting surface 10a of the optical wiring substrate 10 by flip-chip mounting and a semiconductor circuit element 12 electrically connected to the photoelectric conversion element 11.

The photoelectric conversion element 11 is configured such that a plurality of electrodes (a first electrode 111, a second electrode 112 and a third electrode 113 in the embodiment) are disposed in a main body 110. The first electrode 111 and the third electrode 113 are electrically connected to a first wiring pattern 21 formed in the mounting surface 10a of the optical wiring substrate 10. The second electrode 112 is electrically connected to a second wiring pattern 22 formed in the mounting surface 10a of the optical wiring substrate 10. The photoelectric conversion element 11 is mounted on a position facing a reflecting surface 22a formed in a part of the second wiring pattern 22.

In the embodiment, the photoelectric conversion element 11 is configured such that the dimension in a direction parallel to the longitudinal direction of the optical fiber 5 is, for example, 350 μm, and the dimension in a direction perpendicular to the longitudinal direction of the optical fiber 5 is, for example, 250 μm. The distance between the first electrode 111 and the second electrode 112 (the shortest distance) is, for example, 40 to 50 μm.

The photoelectric conversion element 11 is an element configured to convert electric signals to optical signals or convert optical signals to electric signals. The former example includes a light emitting element such as a semiconductor laser element, a LED (Light Emitting Diode). In addition, the latter example includes a light receiving element such as a photo diode. The photoelectric conversion element 11 is configured to emit or receive a light from a light-receiving and emitting part 114 formed in the side of the mounting surface 10a of the optical wiring substrate 10 in a direction perpendicular to the optical wiring substrate 10.

The semiconductor circuit element 12 is mounted on the mounting surface 10a of the optical wiring substrate 10 by flip-chip mounting, and is configured such that a plurality (ten in the embodiment) of pad electrodes 121 are disposed in a main body 120. The plural pad electrodes 121 are electrically connected to the semiconductor circuit element wiring pattern 23 respectively. Of the plural pad electrodes 121, a pad electrode 121a configured to transmit signals is connected to the second wiring pattern 22 to which the second electrode 112 of the photoelectric conversion element 11 is connected, thereby the semiconductor circuit element 12 and the photoelectric conversion element 11 are electrically connected to each other.

If the photoelectric conversion element 11 is configured to convert electric signals to optical signals, the semiconductor circuit element 12 is a driver IC configured to drive the photoelectric conversion element 11. If the photoelectric conversion element 11 is configured to convert optical signals to electric signals, the semiconductor circuit element 12 is a receiver IC configured to amplify signals input from the photoelectric conversion element 11.

Further, the optical wiring substrate 10 can be configured such that electronic components, other than the photoelectric conversion element 11 and the semiconductor circuit element 12, such as a connector, an IC (Integrated Circuit), or an active element (a transistor and the like), a passive element (a resistor, a condenser and the like) are mounted thereon.

The optical fiber 5 is arranged such that the end surface thereof faces the reflecting surface 22a formed in the second wiring pattern 22, and the optical fiber 5 is configured to be held by a holding member 4 from a position above the mounting surface 10a of the optical wiring substrate 10.

(Configuration of Optical Wiring Substrate 10)

Figure 2:
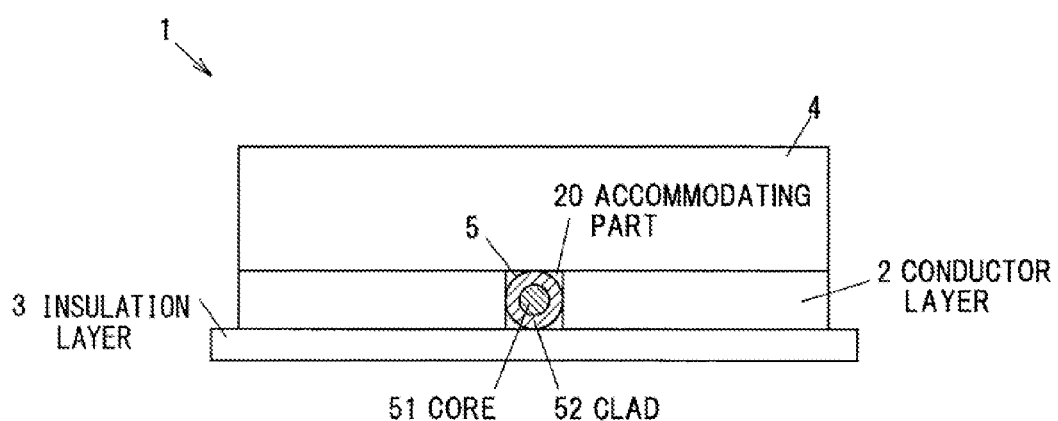
FIG. 2 is a cross-sectional view taken along the line A-A in FIG. 1.

FIG. 2 is a cross-sectional view taken along the line A-A in FIG. 1. FIG. 3A is a cross-sectional view taken along the line B-B in FIG. 1 and FIG. 3B is a partial enlarged view of C part in FIG. 3A.

The optical wiring substrate 10 includes an insulation layer 3 comprised of a resin and an conductor layer 2 laminated on a main surface 3a of the insulation layer 3 and comprised of a metal, the conductor layer having an inclined surface 200a that is inclined relative to an optical axis of the optical fiber 5. In the embodiment, the angle formed between the inclined surface 200a and the main surface 3a of the insulation layer 3 is 45 degrees.

The conductor layer 2 is, for example, comprised of a good conductive metal such as copper, the dimension (H) in the thickness direction thereof is not less than 70 μm. Further, it is preferable that the dimension (H) in the thickness direction of the conductor layer 2 is 70 to 80 μm.

As shown in FIG. 3B, in the embodiment, on the surface 2a of the conductor layer 2, a Ni plating layer 25 comprised of nickel (Ni) and a gold plating layer 26 comprised of gold (Au) are laminated. Similarly, with regard to the inclined surface 200a formed in the conductor layer 2, the Ni plating layer 25 and the gold plating layer 26 are laminated on the surface thereof. The reflecting surface 22a is formed on the outermost surface of the gold plating layer 26.

In the conductor layer 2, the above-mentioned first wiring pattern 21, the second wiring pattern 22 and the semiconductor circuit element wiring pattern 23 are formed. In addition, in the conductor layer 2, an accommodating part 20 configured to guide the optical fiber 5 to the inclined surface 200a (reflecting surface 22a) and to accommodate the end part of the optical fiber 5 is formed. The reflecting surface 22a is formed in a position facing a core 51 of the optical fiber 5 arranged in the accommodating part 20.

As shown in FIG. 3, when a light propagating through optical fiber 5 is emitted from the core 51, the reflecting surface 22a reflects the emitted light toward the photoelectric conversion element 11. If the photoelectric conversion element 11 is a light receiving element, the light reflected by the reflecting surface 22a enters the photoelectric conversion element 11 from the light-receiving and emitting part 114 disposed in the main body 110 of the photoelectric conversion element 11, and the photoelectric conversion element 11 converts light signals based on the incident light to electric signals.

In addition, if the photoelectric conversion element 11 is a light emitting element, the photoelectric conversion element 11 converts electric signals output from the semiconductor circuit element 12 to light signals, and emits the light exhibiting the light signals from the light-receiving and emitting part 114. The emitted light is reflected by the reflecting surface 22a toward the end surface 5a of the optical fiber 5 and enters the core 51 so as to propagate through the optical fiber 5. FIG. 3A shows the optical path L that uses the optical fiber 5 as a propagating medium of the light by an alternate long and short dash line.

The insulation layer 3 is comprised of, for example, a resin such as polyimide, and the thickness thereof is, for example, 38 μm. The insulation layer 3 has a supporting surface 20a configured to support the optical fiber 5 accommodated in the accommodating part 20. More particularly, the accommodating part 20 passes through the conductor layer 2 over the whole of the conductor layer 2 in the thickness direction, and the main surface 3a of the insulation layer 3 is exposed. Accordingly, the main surface 3a of the insulation layer 3 is configured such that a part thereof is formed as the supporting surface 20a of the accommodating part 20.

The optical fiber 5 includes the core 51 and the clad 52. In the embodiment, the optical fiber 5 is configured such that the core 51 has a diameter of, for example, 50 μm, and the clad 52 has a thickness in a radial direction of, for example, 15 μm. Namely, the optical fiber 5 has a diameter (a diameter obtained by summing the core 51 and the clad 52) of 80 μm, the dimension is nearly equal to the dimension H of the conductor layer 2 in the thickness direction.

The accommodating part 20 is covered by the holding member 4 from a position above the conductor layer 2 and the optical fiber 5 is fixed by an adhesive agent or the like that is filled in the accommodating part 20. In the embodiment, the clad 52 of the optical fiber 5 is configured such that the peripheral surface thereof is in contact with the inner surface of the accommodating part 20.

Figure 4:
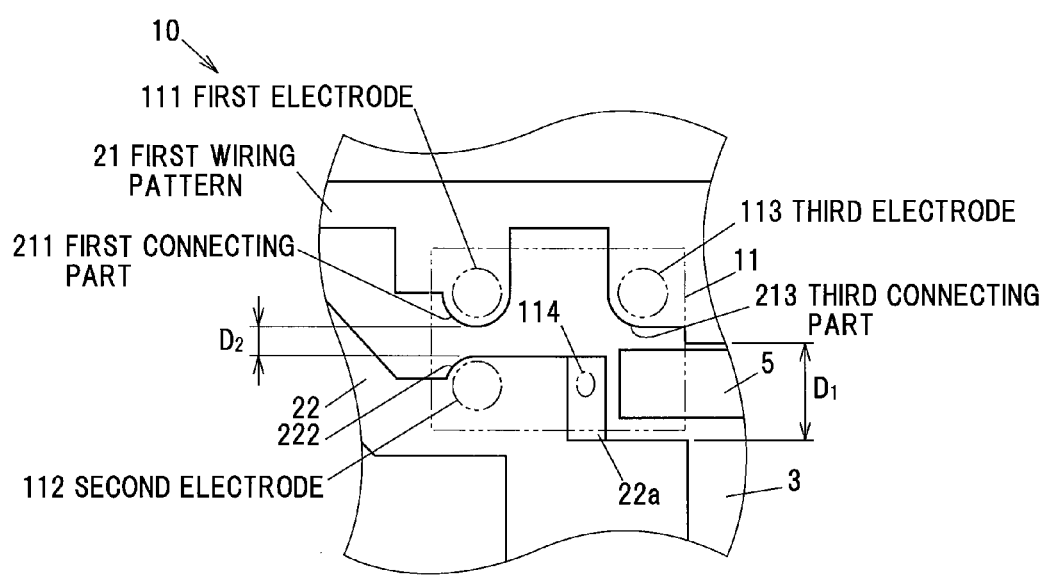
FIG. 4 is a partial enlarged view of a photoelectric conversion element and a peripheral part thereof in FIG. 1.

FIG. 4 is a partial enlarged view of the photoelectric conversion element 11 and the peripheral part thereof in FIG. 1. Further, FIG. 4 shows the outline of the photoelectric conversion element 11 by an alternate long and two short dashes line.

The first wiring pattern 21 formed in the conductor layer 2 has a first connecting part 211 to which the first electrode 111 of the photoelectric conversion element 11 is connected, and a third connecting part 213 to which the third electrode 113 of the photoelectric conversion element 11 is connected. The first connecting part 211 is configured such that a part of the outer edge thereof is formed in an arc-like shape so as to correspond to the first electrode 111 that has a circular shape. Similarly, the third connecting part 213 is configured such that a part of the outer edge thereof is formed in an arc-like shape so as to correspond to the third electrode 113 that has a circular shape. A distance between the first connecting part 211 and the third connecting part 213 is configured to comply with a distance between the first electrode 111 and the third electrode 113.

The second wiring pattern 22 formed in the conductor layer 2 has a second connecting part 222 to which the second electrode 112 of the photoelectric conversion element 11 is connected. The second connecting part 222 is configured, similarly to the above-mentioned the first connecting part 211 and the third connecting part 213, such that a part of the outer edge thereof is formed in an arc-like shape so as to correspond to the second electrode 112 that has a circular shape.

A distance between the first wiring pattern 21 and the second wiring pattern 22 is configured to be narrowest in a region between the first connecting part 211 and the second connecting part 222, and the distance (the shortest distance) $D_2$ between the first connecting part 211 and the second connecting part 222 is shorter than a dimension H in the thickness direction of the conductor layer 2 ($D_2 < H$) (refer to FIG. 3A). In the embodiment, the distance $D_1$ between the first wiring pattern 21 and the second wiring pattern 22 is not less than the dimension H in the thickness direction of the conductor layer 2 ($D_1 \geq H$) except for a distance between first connecting part 211 and the second connecting part 222.

(Manufacturing Method of the Optical Wiring Substrate 10)

Next, a manufacturing method of the optical wiring substrate 10 will be explained referring to FIGS. 5A to 5C and FIGS. 6A to 6C.

Figure 5A:
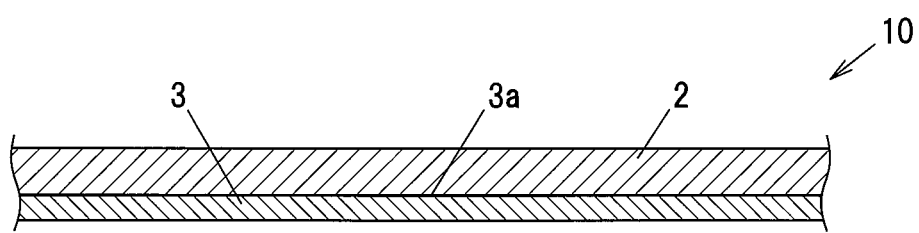
FIGS. 5A to 5C are cross-sectional views schematically showing a forming process of the optical wiring substrate.
Figure 5B:
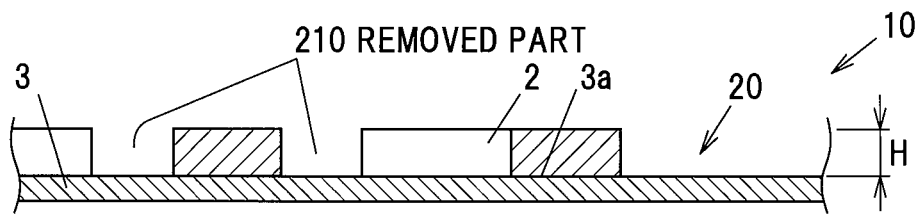
Figure 5C:
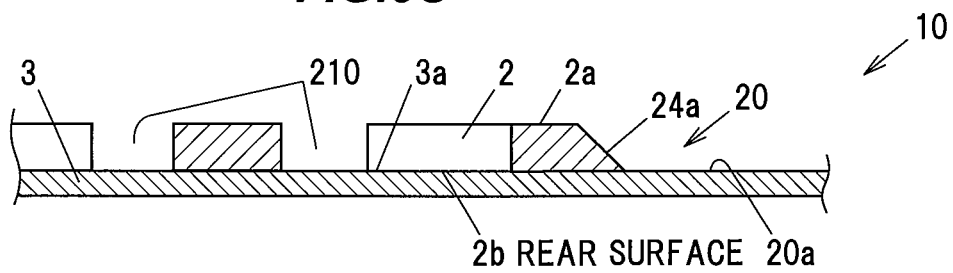
Figure 6A:
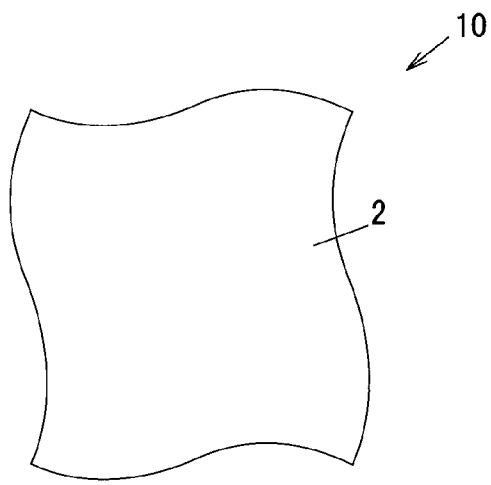
FIGS. 6A to 6C are plan views schematically showing a forming process of the optical wiring substrate.
Figure 6B:
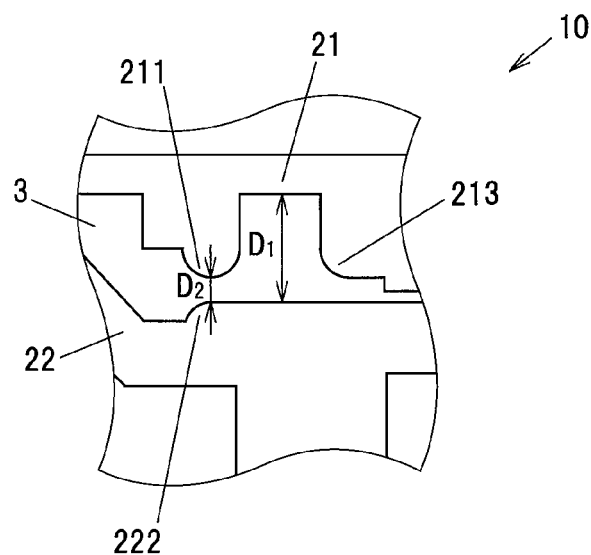
Figure 6C:
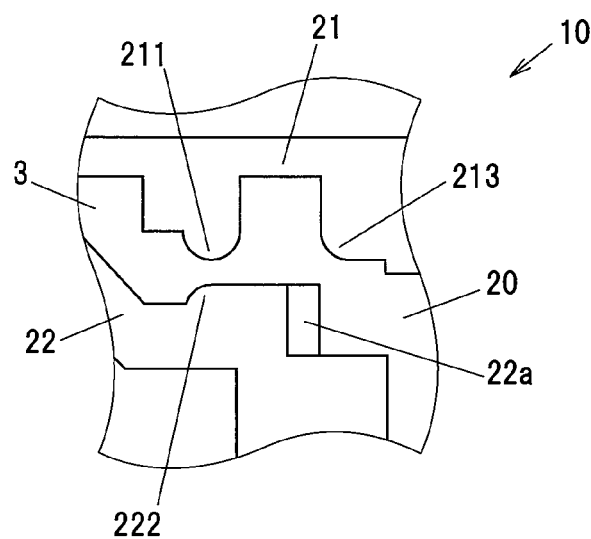

FIGS. 5A to 5C are cross-sectional views schematically showing a forming process of the optical wiring substrate 10. FIGS. 6A to 6C are plan views schematically showing a forming process of the optical wiring substrate 10.

The manufacturing process of the optical wiring substrate 10 includes a first step of forming the conductor layer 2 on the main surface 3a of the insulation layer 3, a second step of removing a part of the conductor layer 2 so as to form the first wiring pattern 21, the second wiring pattern 22, the semiconductor circuit element wiring pattern 23 and the accommodating part 20, a third step of forming the inclined surface 200a and the accommodating part 20, and a fourth step of laminating the Ni plating layer 25 and the gold plating layer 26 on the front surface 2a of the conductor layer 2 and the inclined surface 200a. Hereinafter, the first to fourth steps will be explained in more detail.

As shown in FIG. 5A and FIG. 6A, in the first step, the conductor layer 2 is formed on the whole of the main surface 3a of the insulation layer 3, for example, by adhesion, vapor deposition, or electroless plating. In the embodiment, the conductor layer 2 is comprised of copper (Cu) as a main component that has a good electrical conductivity.

As shown in FIG. 5B and FIG. 6B, in the second step, a part of the conductor layer 2 is removed by etching so as to respectively form the first wiring pattern 21, the second wiring pattern 22, the semiconductor circuit element wiring pattern 23 and the accommodating part 20. In more particular, the second step includes a step of coating a region of the conductor layer 2 except for a part corresponding to the removed part 210 with a resist, and a step of removing the part of the conductor layer 2 which is not coated with the resist by etching.

In the step of coating the conductor layer 2 with the resist, the conductor layer 2 is coated with the resist configured such that the region between the first connecting part 211 and the second connecting part 222 is narrowest, and the distance $D_2$ between the first connecting part 211 and the second connecting part 222 is shorter than a dimension H in the thickness direction of the conductor layer 2 ($D_2$<H).

In the step of removing the conductor layer 2 by etching, a part of the conductor layer 2 which is not coated with the resist is dissolved by etching. Thereby the conductor layer 2 corresponding to the removed part 210 is dissolved so as to leave only the conductor layer 2 corresponding to the first wiring pattern 21, the second wiring pattern 22, the semiconductor circuit element wiring pattern 23 (not shown) and the accommodating part 20. At this time, a part of the main surface 3a of the insulation layer 3 is formed as the supporting surface 20a of the accommodating part 20.

As shown in FIG. 5C and FIG. 6C, in the third step, the conductor layer 2 is cut obliquely from the front surface 2a to rear surface 2b of the conductor layer 2, thereby the inclined surface 200a is formed.

In the fourth step, platings of nickel (Ni) and gold (Au) are applied to the front surface 2a of the conductor layer 2 and the surface of the inclined surface 200a so as to form the Ni plating layer 25 and the gold plating layer 26. The nickel (Ni) plating, the gold (Au) plating and the like can be carried out by, for example, electroless plating. The reflecting surface 22a is formed on the outermost surface of the gold plating layer 26.

Operation and Advantage of the Embodiment

According to the above-mentioned embodiment, the following operation and advantage can be obtained.

A distance between the first wiring pattern 21 and the second wiring pattern 22 is configured to be narrowest in a region between the first connecting part 211 and the second connecting part 222, and the distance $D_2$ between the first connecting part 211 and the second connecting part 222 is shorter than a dimension H in the thickness direction of the conductor layer 2 ($D_2$<H), thereby even if the distance between the first electrode 111 and the second electrode 112 of the photoelectric conversion element 11 is equal to the dimension H in the thickness direction of the conductor layer 2, the photoelectric conversion element 11 can be mounted on the first wiring pattern 21 and the second wiring pattern 22.

Namely, it is difficult to form the distance between the first wiring pattern 21 and the second wiring pattern 22 so as to be narrower than the dimension H in the thickness direction of the conductor layer 2 over a long section in which the first wiring pattern 21 and the second wiring pattern 22 are juxtaposed with each other in terms of the mobility of etching liquid, but if the distance between the first wiring pattern 21 and the second wiring pattern 22 is configured to locally be shorter than the dimension H in the thickness direction of the conductor layer 2 in a region between the first connecting part 211 and the second connecting part 222, the region between the first wiring pattern 21 and the second wiring pattern 22 can be etched without problem. This can be considered to be due to the fact that if the section in which the distance between the first wiring pattern 21 and the second wiring pattern 22 is narrower than the dimension H in the thickness direction of the conductor layer 2 is shorter, the etching liquid is mobilized via the peripheral part of the section so that etching can be carried out. Thereby even in the optical wiring substrate 10 on which the conductor layer 2 being thick is formed, the photoelectric conversion element 11 being downsized can be mounted thereon.

Second Embodiment

Figure 7:
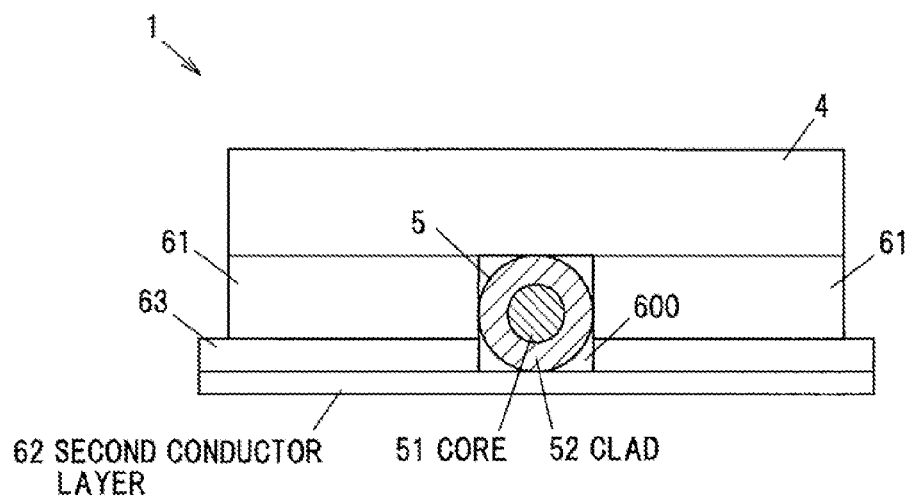
FIG. 7 is a cross-sectional view schematically showing a configuration example of an optical wiring substrate and an optical module including the optical wiring substrate according to a second embodiment of the invention, viewed from the longitudinal direction of an optical fiber.

Next, the second embodiment according to the invention will be explained referring to FIGS. 7 to 9. In FIGS. 7 to 9, with regard to components having the same structure and function as those explained for the optical wiring substrate 10 used in the first embodiment, the same reference numerals will be used therefor, and the overlapped explanation will be omitted.

FIG. 7 is a cross-sectional view schematically showing a configuration example of an optical wiring substrate 6 and an optical module 1 including the optical wiring substrate according to the second embodiment of the invention, viewed from the longitudinal direction of the optical fiber 5. FIG. 8A is a cross-sectional view schematically showing the optical module 1 according to the second embodiment of the invention, and FIG. 8B is a partial enlarged view of D part in FIG. 8A.

The optical wiring substrate 6 according to the embodiment includes an insulation layer 63 comprised of a resin, a first conductor layer 61 laminated on a first main surface 63a of the insulation layer 63 and comprised of a metal, the conductor layer having an inclined surface 610a that is inclined relative to an optical axis of the optical fiber 5, and a second conductor layer 62 configured to be arranged parallel to the first conductor layer 61 across the insulation layer 63. The insulation layer 63 is configured to insulate between the first conductor layer 61 and the second conductor layer 62.

The first conductor layer 61 is, for example, comprised of a good conductive metal such as copper, and has a thickness of, for example, 40 to 80 µm. As shown in FIG. 8B, in the embodiment, on the surface 61a of the first conductor layer 61, a Ni plating layer 612 comprised of nickel (Ni) and a gold plating layer 613 comprised of gold (Au) are laminated. Similarly, with regard to the inclined surface 610a formed in the first conductor layer 61, the Ni plating layer 612 the gold plating layer 613 are laminated on the surface thereof. The reflecting surface 601a is formed on the outermost surface of the gold plating layer 613.

In the first conductor layer 61, similarly to the first embodiment, the first wiring pattern 21, the second wiring pattern 22 and the semiconductor circuit element wiring pattern 23 are formed, and in a part of the second wiring pattern 22, the formed. The inclined surface 610a (reflecting surface 601a) is formed in a position facing the core 51 of the optical fiber 5.

The insulation layer 63 is comprised of, for example, a resin such as polyimide. As shown in FIG. 8B, the insulation layer 63 is configured such that a dimension $t_1$ thereof in the thickness direction is not less than 0.8 times and not more than 1.2 times relative to a thickness dimension $t_2$ of the clad 52 in a diameter direction ($0.8 \times t_2 \le t_1 \le 1.2 \times t_2$). In the embodiment, the dimension of the insulation layer 63 in the thickness direction is, for example, 38 µm.

In the optical wiring substrate 6, an accommodating part 600 configured to extend along the longitudinal direction of the optical fiber 5 so as to accommodate at least a part of the optical fiber 5 is formed over the whole of the first conductor layer 61 and the insulation layer 63 in the thickness direction. In the insulation layer 63 in one end (end edge) of the accommodating part 600, an end surface 63c facing the clad 52 of the optical fiber 5 is formed.

The second conductor layer 62 is, for example, comprised of a good conductive metal such as copper, and has a supporting surface 600a configured to support the optical fiber 5 accommodated in the accommodating part 600. More particularly, the accommodating part 600 passes through over the whole of the first conductor layer 61 and the insulation layer 63 in the thickness direction, and a rear surface 62b of the second conductor layer 62 is exposed. Accordingly, the rear surface 62b of the second conductor layer 62 is configured such that a part thereof is formed as the supporting surface 600a of the accommodating part 600. Further, similarly to the first conductor layer 61, wiring patterns can be also formed on the second conductor layer 62.

FIGS. 9A to 9D are cross-sectional views schematically showing a forming process of the optical wiring substrate 6 according to the second embodiment of the invention.

The manufacturing process of the optical wiring substrate 6 according to the embodiment includes the first step of forming the first conductor layer 61 on a first main surface 63a of the insulation layer 63, and forming the second conductor layer 62 on a second main surface 63b of the insulation layer 63, the second step of removing a part of the first conductor layer 61 so as to form wiring patterns (the first wiring pattern 21, the second wiring pattern 22 and the semiconductor circuit element wiring pattern 23), and forming a concave part 611 that becomes the accommodating part 600, the third step of forming the inclined surface 610a in the first conductor layer 61, the fourth step of removing the insulation layer 63 corresponding to the bottom surface of the concave part 611 over the whole thereof in the thickness direction up to the second conductor layer 62, thereby forming the accommodating part 600, and forming the end surface 63c facing the clad 52 of the optical fiber 5, and the fifth step of laminating the Ni plating layer 612 and the gold plating layer 613 on the first conductor layer 61, the second conductor layer 62 and the inclined surface 610a. Hereinafter, the first to fifth steps will be explained in more detail.

Figure 9A:
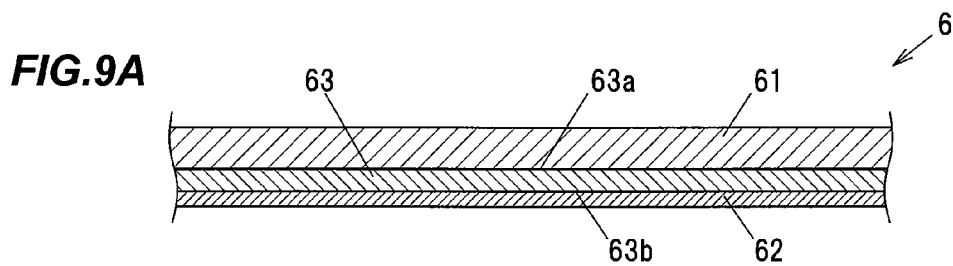
FIGS. 9A to 9D are cross-sectional views schematically showing a forming process of the optical wiring substrate according to the second embodiment of the invention.

As shown in FIG. 9A, in the first step, the first conductor layer 61 is formed on the whole surface of the first main surface 63a of the insulation layer 63 and the second conductor layer 62 is formed on the whole surface of the second main surface 63b of the insulation layer 63, for example, by adhesion, vapor deposition, or electroless plating respectively. In the embodiment, the first conductor layer 61 and the second conductor layer 62 are comprised of copper (Cu) as a main component that has a good electrical conductivity.

Figure 9B:
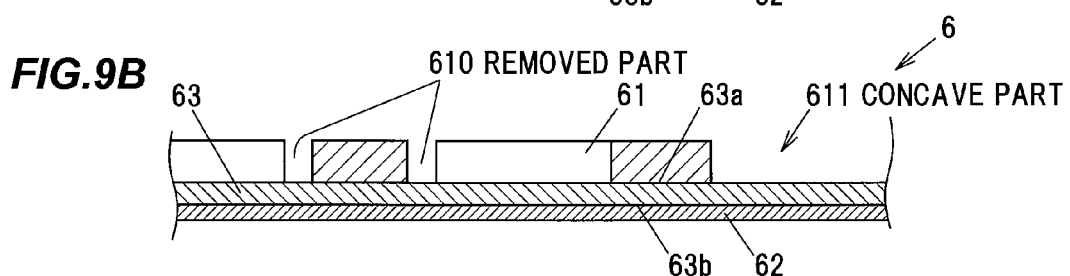

As shown in FIG. 9B, in the second step, a part of the first conductor layer 61 is removed by etching so as to respectively form the first wiring pattern 21, the second wiring pattern 22 and the semiconductor circuit element wiring pattern 23, and to form the concave part 611 that becomes the accommodating part 600. In more particular, regions of the first conductor layer 61 except for a part corresponding to the removed part 610 and a part corresponding to the concave part 611 are coated with a resist, and parts of the first conductor layer 61 which are not coated with the resist are dissolved by etching.

Similarly to the first embodiment, in the step of coating with the resist, the first conductor layer 61 is coated with the resist configured such that the region between the first connecting part 211 and the second connecting part 222 is narrowest, and the distance between the first connecting part 211 and the second connecting part 222 is shorter than a dimension in the thickness direction of the first conductor layer 61.

In the step removing the first conductor layer 61 by etching, a part of the first conductor layer 61 which is not coated with the resist is dissolved by etching. Thereby the first conductor layer 61 corresponding to the removed part 610 and the concave part 611 is dissolved so as to leave only the first conductor layer 61 corresponding to the first wiring pattern 21, the second wiring pattern 22, the semiconductor circuit element wiring pattern 23 and the concave part 611.

Further, in the step, similarly to the first conductor layer 61, a part of the second conductor layer 62 may be removed by etching so as to form wiring patterns in the second conductor layer 62.

Figure 9C:
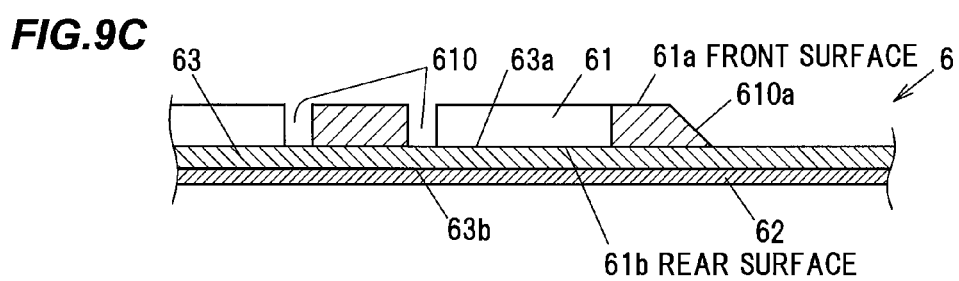

As shown in FIG. 9C, in the third step, the first conductor layer 61 is cut obliquely from the front surface 61a to rear surface 61b of the first conductor layer 61, thereby the inclined surface 610a is formed.

Figure 9D:
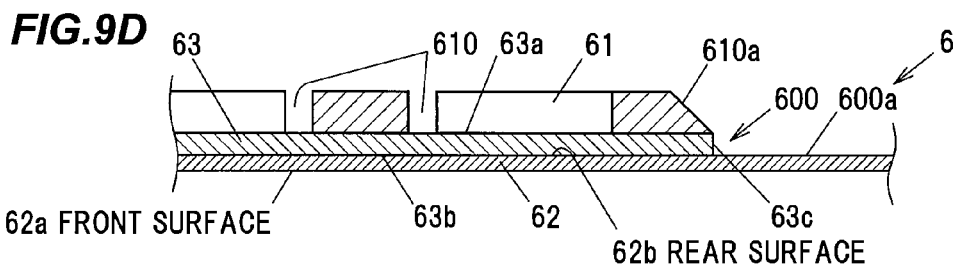

As shown in FIG. 9D, in the fourth step, a laser light is irradiated from a perpendicular direction to the first main surface 63a of the insulation layer 63 corresponding to the bottom surface of the concave part 611. As the laser light, more particularly, for example, an excimer laser or an UV laser (ultraviolet laser) can be used. By the irradiation of the laser light, the accommodating part 600 that accommodates the optical fiber 5 is formed, and the end surface 63c in the end edge of the accommodating part 600 is formed in the insulation layer 63. The intensity of the laser light is an intensity that the insulation layer 63 can be cut but the second conductor layer 62 cannot be cut by the irradiation of the light. Accordingly, a part of the rear surface 62b of the second conductor layer 62 that remains without being removed by the irradiation of the laser light is formed as the supporting surface 600a of the accommodating part 600. In the embodiment, the end surface 63c is formed to be perpendicular to the supporting surface 600a of the accommodating part 600 (the rear surface 62b of the second conductor layer 62), and functions as a positioning part when the optical fiber 5 is inserted into the accommodating part 600.

In the fifth step, similarly to the first embodiment, plating of nickel (Ni), gold (Au) and the like is applied to the front surface 61a of the first conductor layer 61, the inclined surface 610a and the front surface 62a of the second conductor layer 62 so as to form the Ni plating layer 612 and the gold plating layer 613. The nickel (Ni) plating, the gold (Au) plating and the like can be carried out by, for example, electroless plating. The reflecting surface 601a is formed on the outermost surface of the gold plating layer 613.

Operation and Advantage of the Second Embodiment

In the above-mentioned second embodiment, the same operation and advantage as those of the first embodiment can be also obtained.

Summary of the Embodiments

Next, the technical idea grasped from the above-explained embodiments will be described by utilizing the reference numerals and the like in the embodiments. However, the respective reference numerals and the like in the following description do not limit the constitutional components in the scope of the claim to the members concretely shown in the embodiments.

[1] An optical wiring substrate (10), comprising an insulation layer (3) comprised of a resin, an conductor layer (2) laminated on the insulation layer (3) and comprised of a metal, the conductor layer (2) having an inclined surface (200a) that is inclined relative to an optical axis of an optical fiber (5), wherein a first wiring pattern (21) and a second wiring pattern (22) are formed in the conductor layer (2), the first wiring pattern (21) comprising a first connecting part (211) to which a first electrode (111) of an photoelectric conversion element (11), and the second wiring pattern (22)

comprising a second connecting part (222) to which a second electrode (112) of the photoelectric conversion element (11), a distance between the first wiring pattern (21) and the second wiring pattern (22) is configured to be narrowest in a region between the first connecting part (211) and the second connecting part (222) is, and the distance ($D_2$) between the first connecting part (211) and the second connecting part (222) is shorter than a dimension (H) of the conductor layer (2) in the thickness direction.

[2] The optical wiring substrate (10) according to [1], wherein the dimension of (H) the conductor layer (2) in the thickness direction is not less than 40 μm.

[3] An optical module (1), comprising the optical wiring substrate (10) according to [1] or [2], and the photoelectric conversion element (11) mounted on the optical wiring substrate (10) by flip-chip mounting.

[4] A manufacturing method of the optical wiring substrate (10) according to [1] or [2], comprising forming the conductor layer (2) on a surface (3a) of the insulation layer (3) and removing a part of the conductor layer (2) so as to form the first wiring pattern (21) and the second wiring pattern (22), wherein the forming of the first wiring pattern (21) and the second wiring pattern (22) comprises coating a resist on the conductor layer (2) such that a region between the first connecting part (211) and the second connecting part (222) is narrowest, and the distance ($D_2$) between the first connecting part (211) and the second connecting part (222) is shorter than a dimension (H) of the conductor layer (2) in the thickness direction, and removing by etching a part of the conductor layer (2) that is not coated with the resist.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in the above-mentioned embodiments, a configuration that only one optical module 1 is mounted on the optical wiring substrate 10 has been explained, but not limited to this, a plurality of optical module structures may be formed in the optical wiring substrate 10.

In addition, in the above-mentioned embodiments, the optical fiber 5 is configured such that the peripheral surface of the clad 52 is in contact with the inner surface 40a of the concave part 40 of the holding member 4, but the optical fiber 5 is fixed by adhesives and the like filled in the concave part 40, thus the peripheral surface of the clad 52 does not have to be in contact with the inner surface 40a of the concave part 40 of the holding member 4 and the main surface 3a of the insulation layer 3.

In addition, in the above-mentioned embodiment, the optical wiring substrate 10 is mainly comprised of the insulation layer 3 and the conductor layer 2, but not limited to this, a conductor layer in which wiring patterns are formed may be also formed in the rear surface side of the insulation layer 3. This configuration can improve the arrangement of wiring.

In addition, in the above-mentioned embodiments, a configuration that the conductor layer 2 is comprised of copper (Cu) has been explained, but not limited to this, a part or the whole of the conductor layer 2 may be comprised of, for example, aluminum (Al). Also, materials of the plating layers (the Ni plating layer 25 and the gold plating layer 26) are not limited to the above-mentioned materials. Materials of the insulation layer 3 are not limited to polyimide, but, for example, polyethylene terephthalate (PET) may be also used.

What is claimed is:

1. An optical wiring substrate configured to hold an optical fiber, comprising:
    an insulation layer comprising a resin; and
    a conductor layer formed on the insulation layer and comprising a metal and an inclined surface inclined relative to an optical axis of the optical fiber,
    wherein a first wiring pattern and a second wiring pattern of the conductor layer contact and extend along a surface of the insulation layer, the first wiring pattern comprising a first connecting part to which a first electrode of a photoelectric conversion element is connected, and the second wiring pattern comprising a second connecting part to which a second electrode of the photoelectric conversion element is connected,
    wherein a distance between the first wiring pattern and the second wiring pattern contacting and extending along the surface of the insulation layer is narrowest between the first connecting part and the second connecting part, and
    wherein a distance between the first connecting part and the second connecting part is less than a dimension of the conductor layer in a thickness direction thereof,
    wherein the photoelectric conversion element is configured to be electrically connected to a semiconductor circuit element, and
    wherein the distance between the first wiring pattern and the second wiring pattern is not less than the dimension in the thickness direction of the conductor layer except for the distance between the first connecting part and the second connecting part.

2. The optical wiring substrate according to claim 1, wherein the dimension of the conductor layer in the thickness direction is not less than 40 μm.

3. An optical module, comprising:
    the optical wiring substrate according to claim 1;
    the photoelectric conversion element mounted on the optical wiring substrate by flip-chip mounting, and
    a semiconductor circuit element electrically connected to the photoelectric conversion element.

4. A manufacturing method of an optical wiring substrate configured to hold an optical fiber,
    the optical wiring substrate comprising:
    an insulation layer comprising a resin; and
    a conductor layer formed on the insulation layer and comprising a metal and an inclined surface inclined relative to an optical axis of optical fiber,
    wherein a first wiring pattern and a second wiring pattern are formed in the conductor layer, the first wiring pattern comprising a first connecting part to which a first electrode of a photoelectric conversion element is connected, and the second wiring pattern comprising a second connecting part to which a second electrode of the photoelectric conversion element is connected,
    wherein a distance between the first wiring pattern and the second wiring pattern is narrowest between the first connecting part and the second connecting part, and
    wherein a distance between the first connecting part and the second connecting part is less than a dimension of the conductor layer in a thickness direction thereof,
    wherein the photoelectric conversion element is configured to be electrically connected to a semiconductor circuit element,
    the manufacturing method comprising:
    forming the conductor layer on a surface of the insulation layer; and removing a part of the conductor layer so as to form the first wiring pattern and the second wiring pattern, wherein the forming of the first wiring pattern and the second wiring pattern comprises:

coating a resist on the conductor layer such that the distance between the first wiring pattern and the second wiring pattern is narrowest between the first connecting part and the second connecting part, and the distance between the first connecting part and the second connecting part is less than the dimension of the conductor layer in the thickness direction; and removing by etching a part of the conductor layer that is not coated with the resist.

5. An optical wiring substrate configured to hold an optical fiber, comprising:

an insulation layer comprising a resin; and a conductor layer formed on the insulation layer and comprising a metal and an inclined surface inclined relative to an optical axis of the optical fiber, wherein a first wiring pattern and a second wiring pattern of the conductor layer contact and extend along a surface of the insulation layer, the first wiring pattern comprising a first connecting part to which a first electrode of a photoelectric conversion element is connected, and the second wiring pattern comprising a second connecting part to which a second electrode of the photoelectric conversion element is connected, wherein a distance between the first wiring pattern and the second wiring pattern contacting and extending along the surface of the insulation layer is narrowest between the first connecting part and the second connecting part, and wherein a distance between the first connecting part and the second connecting part is less than a dimension of the conductor layer in a thickness direction thereof, wherein the photoelectric conversion element is configured to be electrically connected to a semiconductor circuit element, wherein an optical fiber accommodating part configured to accommodate the optical fiber is provided between the first wiring pattern and the second wiring pattern.

6. The optical wiring substrate according to claim 1, wherein the inclined surface is formed as one piece with the first wiring pattern or the second wiring pattern.

7. The optical wiring substrate according to claim 1, wherein the first wiring pattern and the second wiring pattern are formed by etching.

8. The optical wiring substrate according to claim 1, wherein the first wiring pattern and the second wiring pattern are laminated over the surface of the insulation layer.

\* \* \* \* \*